(12) United States Patent
Wong

(10) Patent No.: US 6,822,325 B2
(45) Date of Patent: Nov. 23, 2004

(54) ISOLATING TEMPERATURE SENSITIVE COMPONENTS FROM HEAT SOURCES IN INTEGRATED CIRCUITS

(75) Inventor: Ting-Wah Wong, Cupertino, CA (US)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 10/209,986

(22) Filed: Aug. 1, 2002

(65) Prior Publication Data

US 2004/0021198 A1 Feb. 5, 2004

(51) Int. Cl.[7] .................... H01L 23/34; H01L 21/331
(52) U.S. Cl. .................... 257/717; 257/718; 257/725; 257/728; 438/353; 438/355; 438/404; 438/405
(58) Field of Search .................... 257/510, 717, 257/718, 725, 728; 438/353, 355, 359, 404, 405

(56) References Cited

U.S. PATENT DOCUMENTS 5,900,649 A * 5/1999 Effelsberg .................... 257/81
6,265,285 B1 * 7/2001 Tseng .................... 438/424

* cited by examiner

Primary Examiner—Donghee Kang
(74) Attorney, Agent, or Firm—Martine & Penilla LLP

(57) ABSTRACT

Temperature sensitive devices may be shielded from temperature generating devices on the same integrated circuit by appropriately providing a trench that thermally isolates the heat generating devices from the temperature sensitive devices. In one embodiment, the trench may be formed by a back side etch completely through an integrated circuit wafer. The resulting trench may be filled with a thermally insulating material.

3 Claims, 1 Drawing Sheet

ISOLATING TEMPERATURE SENSITIVE COMPONENTS FROM HEAT SOURCES IN INTEGRATED CIRCUITS

BACKGROUND

This invention relates generally to heat isolation in integrated circuits.

In integrated circuits, a variety of components may be included. Some of these components may be high heat generators. Other components may be relatively sensitive to either higher temperatures or variations in temperatures.

In order to reduce costs, it may be desirable to integrate as many different components in the same integrated circuit. This integration not only reduces costs, but also reduces size. However, integrating more components makes it more likely that temperature sensitive devices may be integrated with high heat generating devices.

Thus, there is a need for better ways to integrated different types of devices into the same integrated circuit without creating heat related problems.

DETAILED DESCRIPTION

Figure 1:
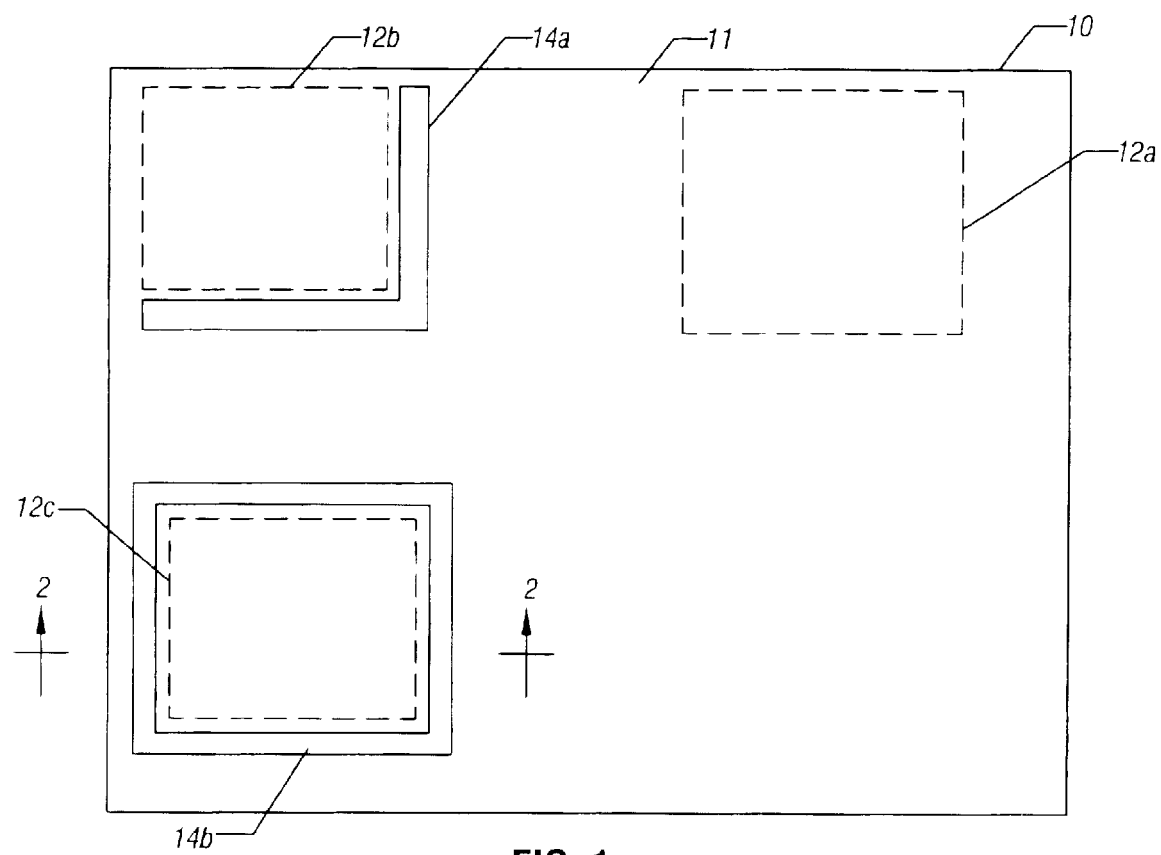
FIG. 1 is a bottom plan view of an integrated circuit in accordance with one embodiment of the present invention.

Referring to FIG. 1, an integrated circuit 10 may include a variety of integrated components. For example, a circuit or device sensitive to temperature variations may be located at the region 12a. A heat generating device or circuit such as a power amplifier may be located at each of the regions 12b and 12c. Thus, it is desirable to isolate the region 12a from both the regions 12b and 12c.

To this end, a filled, L-shaped trench 14a may be arranged around the edges of the region 12b. In this case, the two sides of the relatively rectangular region 12b facing towards the region 12a may be shielded by the filled, L-shaped trench 14a. The region 12c may be isolated by a completely encircling filled trench 14b. The trenches 14 are effective to isolate the heat generating circuit regions 12b and 12c from the temperature sensitive circuit region 12a.

Figure 2:
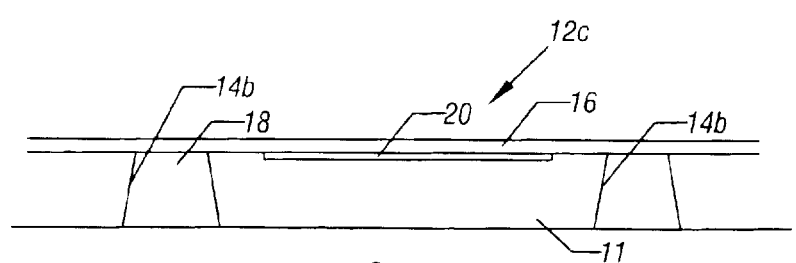
FIG. 2 is an enlarged cross-sectional view taken generally along the line 2—2 in FIG. 1 in accordance with one embodiment of the present invention.

Thus, as shown in FIG. 2, a region 12c of the integrated circuit substrate 10 may have formed therein a heat generating circuit 20. The circuit 20 may be formed in and on the semiconductor substrate 11. Over the substrate 11 may be a top side dielectric layer 16.

In one embodiment of the present invention, the trenches 14 may be formed by a back side etch from the back side of the substrate 11 while the circuit 10 is in the wafer form. The back side etch may use the top side dielectric layer 16 as an etch stop. Thus, in one embodiment of the present invention the back side etch may extend completely through the wafer substrate 11 to reach the etch stop dielectric layer 16 on the top side of the wafer.

Thereafter, the trenches 14 may be filled with a suitable fill material 18 that has suitable heat insulating properties. For example, amorphous silicon dioxide may be utilized as a heat insulating fill material 18. In some embodiments, no trench fill may be utilized. In other embodiments, the trenches 14 may be formed from the top side of the wafer instead of the back side, using conventional isolation trench technology.

As a result, detrimental high temperatures or temperature fluctuations due to high power consuming devices, such as radio frequency power amplifiers, may be reduced as seen by temperature sensitive devices coexisting on the same integrated circuit 10.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method for manufacturing an integrated circuit, comprising:

forming a dielectric layer on a top side of an integrated circuit wafer;

defining a trench completely through said wafer to said dielectric layer from the backside of said wafer;

forming a first circuit sensitive to heat in a first region of said integrated circuit on one side of said trench;

forming a second circuit that generates heat in a second region of said integrated circuit on the opposite side of said trench.

2. The method of claim 1 including filling said trench with a trench fill material.

3. The method of claim 2 including filling said trench with amorphous silicon dioxide.

* * * * *